(12) United States Patent
Sun et al.

(10) Patent No.: US 9,482,941 B2
(45) Date of Patent: Nov. 1, 2016

(54) MASK AND MANUFACTURING METHOD THEREOF

(71) Applicants: BOE Technology Group Co., Ltd., Beijing (CN); BEIJING BOE DISPLAY TECHNOLOGY CO., LTD., Beijing (CN)

(72) Inventors: Zhiyi Sun, Beijing (CN); Ran Zhang, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/428,940

(22) PCT Filed: Jul. 31, 2014

(86) PCT No.: PCT/CN2014/083407
§ 371 (c)(1),
(2) Date: Mar. 17, 2015

(87) PCT Pub. No.: WO2015/035834
PCT Pub. Date: Mar. 19, 2015

(65) Prior Publication Data
US 2016/0011503 A1     Jan. 14, 2016

(30) Foreign Application Priority Data

Sep. 16, 2013  (CN) .......................... 2013 1 0421535

(51) Int. Cl.
*G03F 1/48*     (2012.01)
(52) U.S. Cl.
CPC ....................................... *G03F 1/48* (2013.01)
(58) Field of Classification Search
CPC ......................................................... G03F 1/48
USPC ............................................................ 430/5
See application file for complete search history.

(56) References Cited

U.S. PATENT DOCUMENTS

| 6,277,480 | B1 | 8/2001 | Veerasamy et al. |
| 6,300,042 | B1 | 10/2001 | Mancini et al. |
| 7,635,652 | B2 * | 12/2009 | Chang ................. G03F 1/48 |
| | | | 148/DIG. 106 |
| 2007/0066080 | A1 | 3/2007 | Kugler et al. |
| 2009/0004574 | A1 | 1/2009 | Lee |

FOREIGN PATENT DOCUMENTS

| CN | 1301290 A | 6/2001 |
| CN | 1549954 A | 11/2004 |
| CN | 101266403 A | 9/2008 |
| CN | 101475173 A | 7/2009 |
| CN | 102863154 A | 1/2013 |
| CN | 202886836 U | 4/2013 |
| CN | 103472673 A | 12/2013 |
| JP | H11-7121 A | 1/1999 |
| JP | 200212796 A | 3/2003 |

OTHER PUBLICATIONS

Aug. 12, 2015—(CN)—Second Office Action Appn 201310421535.1 with English Tran.
Oct. 27, 2014 (CN) International Search Report and Written Opinion for PCT/CN2014/083407.
Oct. 27, 2014 (CN) Written Opinion for PCT/CN2014/083407—Eng Tran.
Mar. 31, 2015—(CN) First Office Action—App 201310421535.1.
Mar. 31, 2015—(CN) First Office Action—App 201310421535.1—Eng Tran.
Jan. 5, 2016—(CN)—Third Office Action Appn 201310421535.1 with English Tran.
May 16, 2016—(CN)—Fourth Office Action Appn 201310421535.1 with English Tran.

* cited by examiner

*Primary Examiner* — Christopher Young
(74) *Attorney, Agent, or Firm* — Banner & Witcoff, Ltd.

(57) ABSTRACT

A mask and a manufacturing method thereof are provided. The mask comprises a body and a film layer comprising an oleophobic material and covering the surface of the body, thereby the possibility of the organic coagulation adhering to the surface of the mask is effectively reduced, and the contamination of the mask by the organic solvent and other volatile organic in the photoresist during exposure is also reduced.

15 Claims, 3 Drawing Sheets

US 9,482,941 B2

MASK AND MANUFACTURING METHOD THEREOF

The application is a U.S. National Phase Entry of International Application No. PCT/CN2014/083407 filed on Jul. 31, 2014, designating the United States of America and claiming priority to Chinese Patent Application No. 201310421535.1 filed on Sep. 16, 2013. The present application claims priority to and the benefit of the above-identified applications and the above-identified applications are incorporated by reference herein in their entirety.

TECHNICAL FIELD

Embodiments of the present invention relates to a mask and manufacturing method thereof.

BACKGROUND

In the known lithographic process, especially in the proximity exposure lithography process, due to the reaction heat or light excitation during the exposure process, as illustrated in FIG. 1a, an organic solvent 2 etc. remaining in a photoresist 1 evaporates to a mask 3 and condenses as an organic coagulation 4 on the surface of the mask 3. The contact angle θ between the mask 3 and the organic coagulation 4 is generally less than 90 degrees, as illustrated in FIG. 1b, so that the organic coagulation has a greater infiltration capacity to the mask and it is not easy for the organic coagulation to fall. The organic coagulation adhering to the surface of the mask will contaminate the surface of the mask, seriously affecting the exposure accuracy. In addition, the frequency for cleaning the mask will be increased due to the contamination of the surface of the mask by the organic coagulation, which is not conducive to long-term continuous production.

At present, an organic coagulation processing apparatus is generally installed in an exposed area, the apparatus can decompose the organic coagulation coagulating on the surface of the mask, and then the decomposed organic coagulation can be brought out of the exposure chamber by means of a gas system in the apparatus, thereby reducing the contamination of the mask by the organic coagulation during the exposure process.

SUMMARY

Embodiments of the present invention provide a mask and manufacturing method thereof to reduce the contamination of the mask by the organic solvent in the exposure process.

At least one embodiment of the present invention provides a mask comprising a body, and a film layer which covers the surface of the body and comprises an oleophobic material.

For example, one embodiment of the present invention provides a mask in which a contact angle of an organic coagulation on the film layer is greater than 150°.

For example, one embodiment of the present invention provides a mask in which the oleophobic material is located on the surface of the film layer.

For example, one embodiment of the present invention provides a mask in which the oleophobic material is a fluorine-containing material.

For example, one embodiment of the present invention provides a mask in which the fluorine-containing material is 1H,1H,2H,2H-perfluorodecyltrichlorosilane.

For example, in order to uniformly coat 1H,1H,2H,2H-perfluorodecyltrichlorosilane on the body, a mask provided by one embodiment of the present invention further comprises: a crosslinked layer between the body and the film layer.

One embodiment of the present invention provides a mask in which a material of the crosslinked layer is silicone fiber. For example, the diameter of the silicone fiber is from 20 nm to 60 nm.

One embodiment of the present invention provides a mask in which the fluorine-containing material is fluorinated silicon dioxide nanoparticles. For example, the diameter of each one of the fluorinated silicon dioxide nanoparticles is from 100 nm to 200 nm.

Another embodiment of the present invention provides a manufacturing method of mask, comprising: providing a body of the mask; forming a film layer comprising an oleophobic material and covering the surface of the body on the body of the mask.

One embodiment of the present invention provides a manufacturing method of mask, wherein the oleophobic material is 1H,1H,2H,2H-perfluorodecyltrichlorosilane; the method comprising: forming a crosslinked layer on the body to cover the surface of the body; forming a film layer comprising 1H,1H,2H,2H-perfluorodecyltrichlorosilane and covering the surface of the crosslinked layer on the crosslinked layer.

One embodiment of the present invention provides a manufacturing method of mask, wherein the oleophobic material is fluorinated silicon dioxide nanoparticles; the method comprising: homogeneously dispersing the fluorinated silicon dioxide nanoparticles in an organic solution; spin-coating the organic solution with dispersed fluorinated silicon dioxide nanoparticles on the surface of the body.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make the objects, the technical details and the advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s) without any inventive work, which should be within the scope of the invention.

The shape, the thickness and size of respective film layer in the figures do not reflect the true proportions of the mask, the purpose of which is merely to schematically illustrate the present invention.

The inventors of the present invention have noticed that the way of installing an organic coagulation processing apparatus in an exposure area requires installing a new device; the structure is complicated and the cost is high.

Figure 1A:
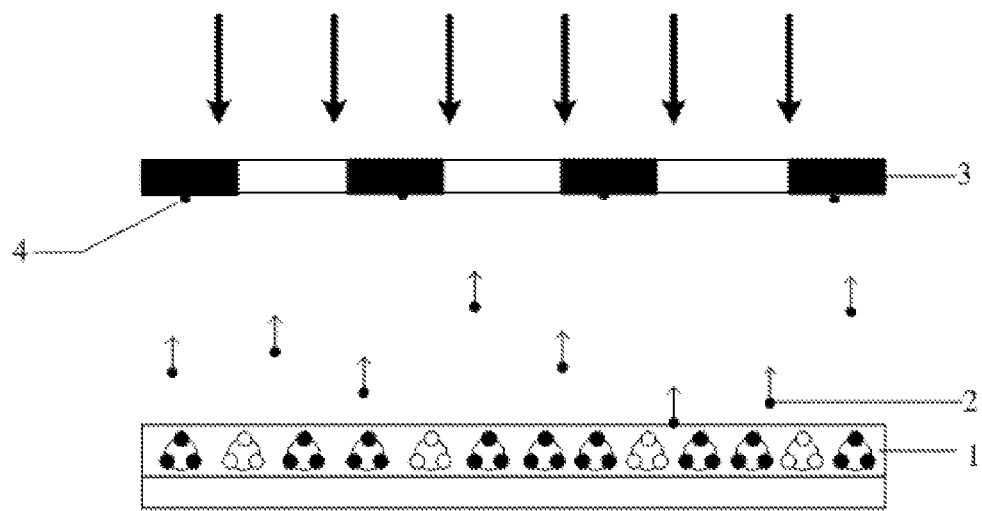
FIG. 1a is a schematic diagram showing a known mask contaminated by an organic solvent in a photoresist during exposure.
Figure 1B:
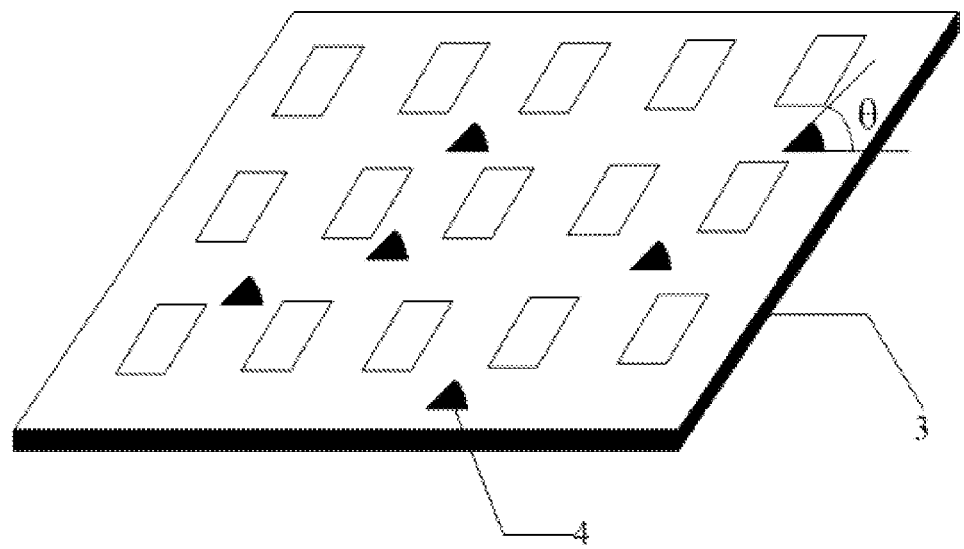
FIG. 1b is a schematic diagram showing a contact angle of an organic coagulation on the surface of the known mask.
Figure 2A:
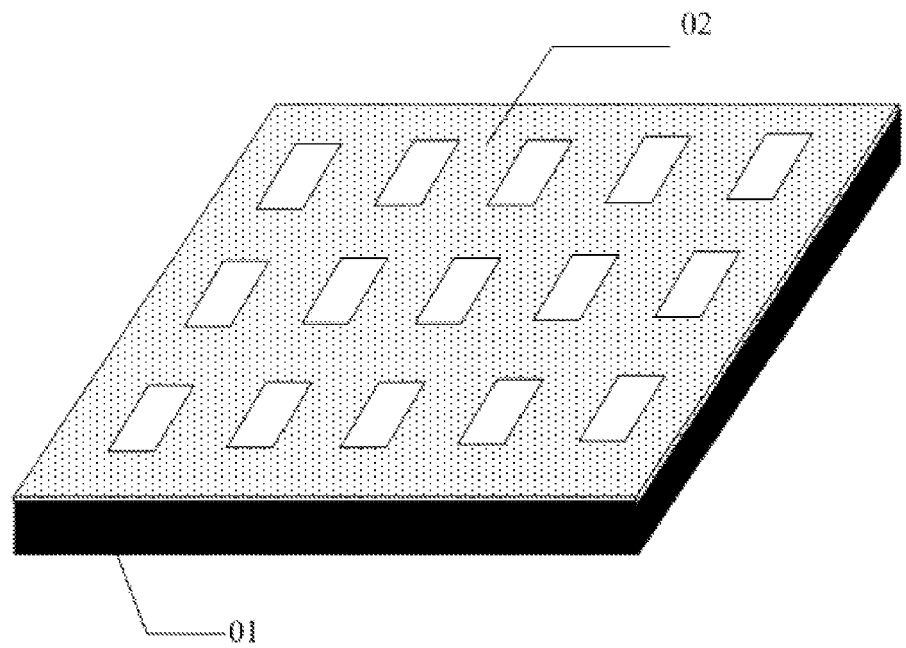
FIGS. 2a and 2b are structurally schematic diagrams of a mask provided by an embodiment of the present invention, respectively.

As shown in FIG. 2a, the mask provided by an embodiment of the present invention includes a body 01 and a film layer 02 comprising an oleophobic material, which covers the surface of the body 01 and can reduce the adhesion of the organic coagulation.

Figure 3A:
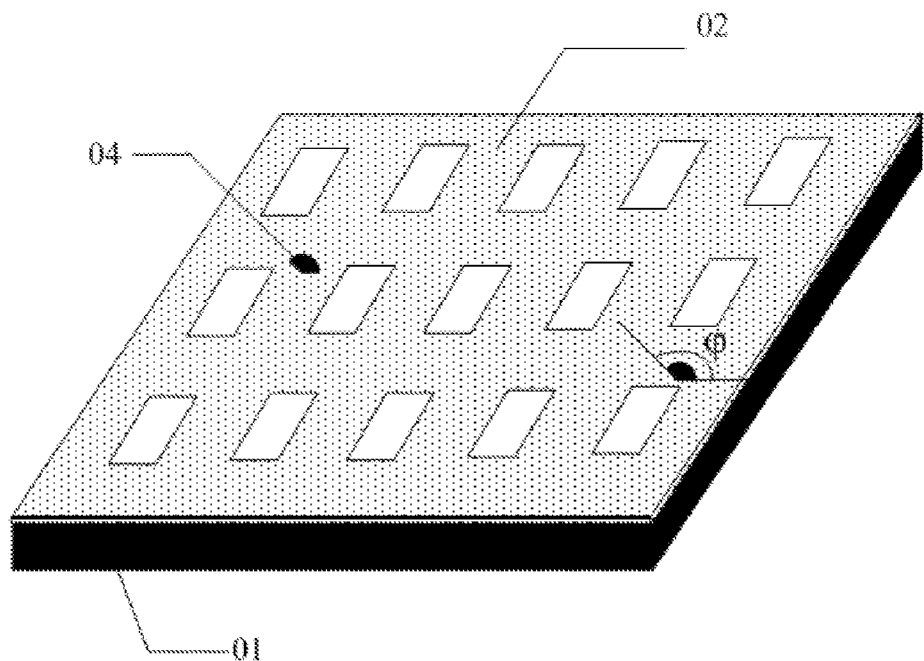
FIG. 3a is a schematic diagram showing a contact angle of an organic coagulation on the surface of the mask provided by an embodiment of the present invention.
Figure 3B:
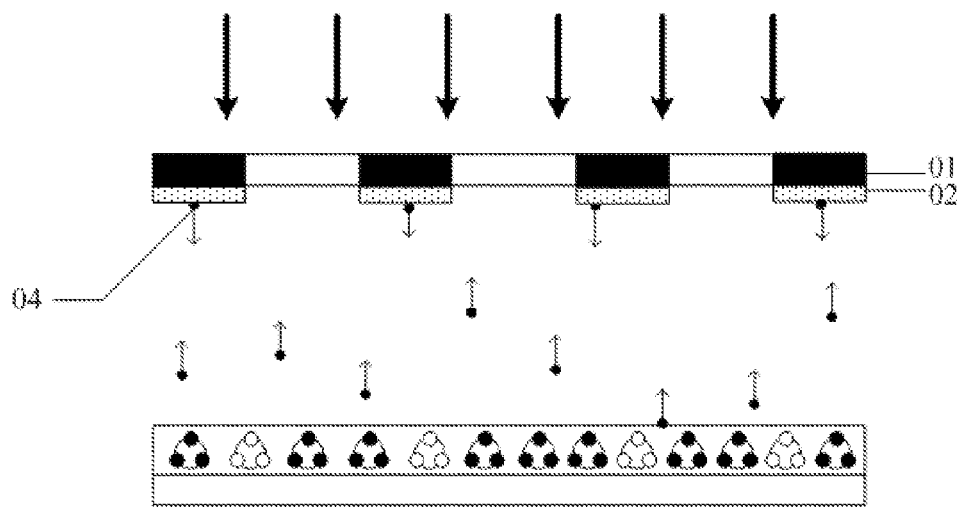
FIG. 3b is a schematic diagram showing the principle of the mask provided by embodiments of the present invention.

An embodiment of the present invention provides a mask, in which the body 01 of the mask is covered with the film layer 02 comprising the oleophobic material. Since a contact angle φ of an organic coagulation 04 on the surface of the film layer 02 is large, and the adhesion is weak, as shown in FIG. 3a, the possibility of the organic coagulation adhering to the surface of the mask can be effectively reduced, as shown in FIG. 3b, thereby reducing the contamination of the mask by the organic solvent in the photoresist during exposure.

The mask provided by the embodiments of the present invention can be applied in various forms. For example, the mask can be a chrome mask, a dry mask or a gravure mask, etc., which is not limited here. Hereinafter, the mask provided by the embodiments of the present invention is described with the chromium mask as an example.

For example, one embodiment of the present invention provides a mask, in which the contact angle of the organic coagulation on the surface of the film layer is greater than 150°, achieving the ultra oleophobic effect. Under the action of the weight of the organic coagulation, the infiltration capacity of the organic coagulation to the mask is small due to its large contact angle on the surface of the mask, and thus it is easy for the organic coagulation to fall from the surface of the mask.

For example, one embodiment of the present invention provides a mask, in which the oleophobic material is present on the surface of the film layer.

For example, one embodiment of the present invention provides a mask, in which the oleophobic material can be a fluorine-containing material.

For example, one embodiment of the present invention provides a mask, in which the fluorine-containing material may be 1H,1H,2H,2H-perfluorodecyltrichlorosilane or fluorinated silicon dioxide nanoparticles. Of course, the used oleophobic material can also be other materials that can achieve the technical solutions of the present invention, which are not limited here.

Figure 2B:
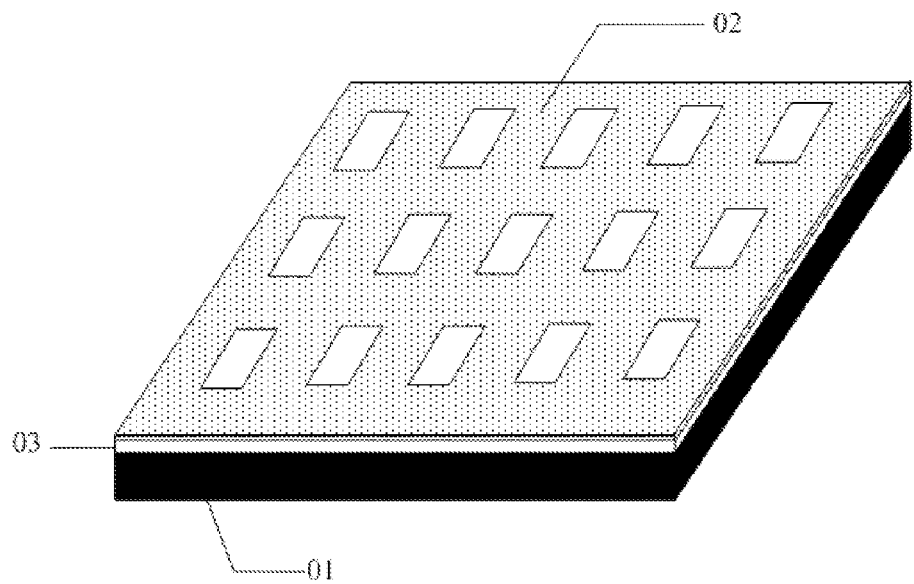

For example, in one embodiment, the fluorine-containing material is 1H,1H,2H,2H-perfluorodecyltrichlorosilane. In order to uniformly coat 1H,1H,2H,2H-perfluorodecyltrichlorosilane on the body, as shown in FIG. 2b, a mask provided by one embodiment of the present invention can further comprise a crosslinked layer 03 between the body 01 and the film layer 02, which enables uniform distribution of 1H,1H,2H,2H-perfluorodecyltrichlorosilane.

One embodiment of the present invention provides a mask, in which a material of the crosslinked layer 03 is silicone fiber. For example, the diameter of the silicone fiber is controlled in the range of 20 nm to 60 nm. Of course, in order to uniformly coat 1H,1H,2H,2H-perfluorodecyltrichlorosilane on the body, the material of the crosslinked layer 03 can also be other materials that can achieve the technical solutions of the present invention, which are not limited here.

For example, in one embodiment, the fluorine-containing material is fluorinated silicon dioxide nanoparticles, the diameter of each one of the fluorided silicon dioxide nanoparticles is for example from 100 nm to 200 nm.

Based on the same inventive concept, embodiments of the present invention also provide a manufacturing method of mask comprising: providing a body of the mask; forming a film layer comprising an oleophobic material on the body of the mask, wherein the film layer covers the surface of the body and can reduce the adhesion of the organic coagulation.

The step of forming the film layer comprising the oleophobic material on the body has been added in the manufacturing method of mask provided by embodiments of the present invention. Since the contact angle of the organic coagulation on the surface of the film layer is large, and the adhesion is weak, the possibility of the organic coagulation adhering to the surface of the mask can be effectively reduced, thereby reducing the contamination of the mask by the organic solvent in the photoresist during exposure.

One embodiment of the present invention provides a manufacturing method of mask, wherein the oleophobic material can be 1H,1H,2H,2H-perfluorodecyltrichlorosilane or fluorinated silicon dioxide nanoparticles, of course, it can also be other materials that can achieve the technical solutions of the present invention, which are not limited here.

One embodiment of the present invention provides a manufacturing method of mask, wherein the oleophobic material is 1H,1H,2H,2H-perfluorodecyltrichlorosilane. Thereby, the examples of forming the film layer comprising the oleophobic material and covering the surface of the body on the body of the mask comprises: forming a crosslinked layer on the body to cover the surface of the body, wherein the crosslinked layer enables the homogeneous distribution of the 1H,1H,2H,2H-perfluorodecyltrichlorosilane to be formed on the surface of the cross-linked layer afterwards; forming a film layer comprising 1H,1H,2H,2H-perfluorodecyltrichlorosilane on the crosslinked layer to cover the surface of the crosslinked layer.

Further, one embodiment of the present invention provides a mask, in which a material of the crosslinked layer is silicone fiber. For example, the diameter of the silicone fiber is controlled in the range of 20 nm to 60 nm. Of course, in order to uniformly coat 1H,1H,2H,2H-perfluorodecyltrichlorosilane on the body, the material of the crosslinked layer can also be other materials that can achieve the technical solutions of the present invention, which are not limited here.

For example, in order to increase the contact surface between the body and the crosslinked layer, in the manufacturing method of mask provided by one embodiment of the present invention, before forming the crosslinked layer covering the surface of the body, the surface of the body can be etched using etching technology to increase the roughness of the surface of the body, so that the crosslinked layer can be formed more easily on the body.

For example, one embodiment of the present invention provides a manufacturing method of a mask, wherein the oleophobic material is fluorinated silicon dioxide nanoparticle. Thus, one example of forming the film layer comprising the oleophobic material and covering the surface of the body on the body of the mask includes: homogeneously dispersing the fluorinated silicon dioxide nanoparticles in an organic solution; spin-coating the organic solution with the dispersed fluorinated silicon dioxide nanoparticles on the surface of the body.

Further, one embodiment of the present invention provides a manufacturing method of mask, wherein for example, the diameter of each one of the fluorinated silicon dioxide nanoparticles is controlled in the range of 100 nm-200 nm.

For example, one embodiment of the present invention provides a manufacturing method of mask, wherein the organic solution can be an isopropanol solution, of course, the organic solution also can be other solutions that can achieve the technical solutions of the present invention, which are not limited here.

The manufacturing method of mask provided by embodiments of the present invention is described in detail below by way of two specific examples.

EXAMPLE 1

1H,1H,2H,2H-perfluorodecyltrichlorosilane is adopted as the oleophobic material comprised in the film layer that covers the body of the mask. The manufacturing method of mask comprises the following steps:

S401: providing a body of the mask.

The body, for example, is a glass plate, a quartz plate or the like.

S402: etching the surface of the mask body using etching technique.

For example, the inductively coupled plasma (ICP) etching technique PlasmaPro™ System 100 ICP180 can be used, and chlorine ($Cl_2$), oxygen ($O_2$) and helium (He) are used as the etching gas to etch the surface of the body so as to increase the roughness of the surface of the body. For example, a etching depth is generally controlled within 50 nm.

S403: forming a crosslinked layer of silicone fiber material on the body.

For example, after being etched, the body can be immersed into a mixed solution of methyltrichlorosilane and water, and a layer of crosslinked silicone nanofibers will grow on the surface of the body through the hydrolysis process of methyl trichlorosilane. For example, the concentration of water is less than or equal to 200 ppm in the mixed solution of methyltrichlorosilane and water. The hydrolysis rate of methyltrichlorosilane can be controlled, and further the diameter of the crosslinked silicone nanofibers can be controlled by adjusting the concentration of water in the mixed solution. Further, e.g., the diameter of each one of the crosslinked silicone nanofibers is generally controlled in the range of 20 nm-60 nm.

S404: activating the surface of the cross-linked layer of silicone fiber material using oxygen plasma.

For example, in one embodiment, under the condition that the pressure of oxygen gas system is maintained at about 30 Pa and the Radio Frequency (RF) power is controlled in the range of 100 W-150 W, the crosslinked layer of silicone fiber material is treated for 5 min-10 min using RF plasma apparatus, and thus active hydroxyl groups are produced on the surface of the crosslinked layer of silicone fiber material. In this way, the roughness of the surface of the crosslinked layer of silicone fiber material is increased, which facilitates the succeeding formation of the oleophobic material on the surface of the crosslinked layer.

S405: anchoring 1H,1H,2H,2H-perfluorodecyltrichlorosilane on the surface of the crosslinked layer of silicone fiber material using molecular deposition method, so as to form the film layer comprising the oleophobic material and covering the surface of the body.

For example, firstly, 1H,1H,2H,2H-perfluorodecyltrichlorosilane is dissolved in a toluene solution, then the crosslinked layer of silicone fiber material is immersed in this toluene solution, 1H,1H,2H,2H-perfluorodecyltrichlorosilane is linked to the active hydroxyl groups on the surface of the crosslinked layer of silicone fiber material, thereby 1H,1H,2H,2H-perfluorodecyltrichlorosilane is anchored on the surface of the crosslinked layer of silicone fiber material, and the film layer containing the oleophobic material and covering the surface of the body is formed.

For example, when the mask manufactured by the above method is exposed, the experiments show that the contact angle of the coagulation of xylene (a solvent commonly used in a negative photoresist) on the surface of the mask is generally greater than 150°, the roll angle is generally less than 5°, and that the adhesion on the mask is also low. Thus, under the action of the weight of the coagulation, it is easy for the coagulation to fall from the surface of the mask surface. And it can also be obtained through experiments that, the surface of the mask also shows good oleophobic property and low adhesivity for other organic solvents such as hexadecane and mineral oil. In addition, the surface of the mask also has a good anti-UV irradiation ability, good anti-reflective property, high transmittance (transmittance greater than 90%) and chemical stability, which satisfies the requirements of the lithography process.

EXAMPLE 2

Fluorinated silicon dioxide nanoparticles are adopted as the oleophobic material that covers the body of the mask. The manufacturing method of the mask comprises the following steps:

S501: manufacturing a body of the mask.

The body, for example, is a glass plate, a quartz plate or the like.

S502: homogeneously dispersing fluorinated silicon dioxide nanoparticles in an isopropanol (Iso Propyl Alcohol, IPA) solution.

S503: spin-coating the isopropanol solution with the dispersed fluorinated silicon dioxide nanoparticles on the surface of the body of the mask, obtaining a film layer containing an oleophobic material and covering the surface of the body.

For example, the fluorinated silicon dioxide nanoparticles used in step S502 can be produced in the following manner:

Firstly, tetraethoxysilane is added to the isopropanol solution and stirred evenly;

Then, under intense stirring, ammonium hydroxide is added to the mixed solution of tetraethoxysilane and isopropyl alcohol;

Thereafter, the mixed solution reflux for about 2 hours at a temperature of about 60 degrees Celsius;

Finally, 1H,1H,2H,2H-perfluorodecyltrichlorosilane is added to the mixed solution, the reaction is terminated, and fluorinated silicon dioxide nanoparticles are obtained. The diameter of each one of the fluorinated silicon dioxide nanoparticles is for example from 100 nm to 200 nm.

For example, when the mask manufactured by the above method is exposed, the experiments show that the contact angle of a coagulation of xylene (a solvent commonly used in negative photoresist) on the surface of the mask is generally greater than 140°, the roll angle is generally less than 3°, and that the adhesion on the mask is also low. Thus, under the action of the weight of coagulation, it is easy for the coagulation to fall from the surface of the mask. And it can also be obtained through experiments that, the surface of the mask also shows super-oleophobic property and low adhesivity for other organic solvents such as decalin and diesel oil.

Embodiments of the present invention provide a mask and a manufacturing method thereof, wherein the mask comprises a body, and a film layer which covers the surface of the body and comprises an oleophobic material. Embodiments of the present invention provide a mask, wherein the body of the mask is covered by a film layer comprising an oleophobic material. Since the contact angle of the organic coagulation on the surface of the film layer is large, and the adhesion is low, the possibility of the organic coagulation adhering to the surface of the mask can be effectively reduced, thereby reducing the contamination of the mask by the organic solvent in the photoresist during exposure.

Obviously, those skilled in the art may make various modifications and variations of the present invention without departing from the spirit and scope of the invention. Thus, if such modifications and variations of the present invention fall into the scope of the claims and the technical equivalents, the present invention is also intended to include these changes and modifications.

The present application claims the benefits of the Chinese Application No. 201310421535.1 filed on Sep. 16, 2013, the entire disclosure of which is incorporated herein by reference.

The invention claimed is:

1. A mask, comprising:
 a body;
 a film layer comprising an oleophobic material and covering the surface of the body; and
 a cross-linked layer disposed between the body and the film layer, the cross-linked layer comprising silicone fiber.

2. The mask according to claim 1, wherein a contact angle of an organic coagulation on the film layer is greater than 150°.

3. The mask according to claim 1, wherein the oleophobic material is located on the surface of the film layer.

4. The mask according to claim 1, wherein the oleophobic material is a fluorine-containing material.

5. The mask according to claim 4, wherein the fluorine-containing material is 1H,1H,2H,2H-perfluorodecyltrichlorosilane.

6. The mask according to claim 1, wherein the diameter of the silicone fiber is from 20 nm to 60 nm.

7. The mask according to claim 4, wherein the fluorine-containing material is fluorinated silicon dioxide nanoparticles, and the diameter of each one of the fluorinated silicon dioxide nanoparticles is from 100 nm to 200 nm.

8. The mask according to claim 2, wherein the oleophobic material is located on the surface of the film layer.

9. The mask according to claim 2, wherein the oleophobic material is a fluorine-containing material.

10. The mask according to claim 3, wherein the oleophobic material is a fluorine-containing material.

11. The mask according to claim 8, wherein the oleophobic material is a fluorine-containing material.

12. A manufacturing method of mask, comprising:
 providing a body of the mask;
 forming a cross-linked layer covering the surface of the body on the body of the mask; and
 forming a film layer comprising an oleophobic material and covering the surface of the cross-linked layer.

13. The manufacturing method according to claim 12, wherein the oleophobic material is 1H,1H,2H,2H-perfluorodecyltrichlorosilane.

14. The manufacturing method according to claim 12, further comprising:
 before forming the cross-linked layer covering the surface of the mask body on the body, etching the surface of the body using an etching technique.

15. The manufacturing method according to claim 12, wherein the oleophobic material is fluorinated silicon dioxide nanoparticles; and
 wherein the method further comprises:
  homogeneously dispersing the fluorinated silicon dioxide nanoparticles in an organic solution; and
  spin-coating the organic solution with dispersed fluorinated silicon dioxide nanoparticles on the surface of the body.

* * * * *